(12) United States Patent
Kubo et al.

(10) Patent No.: US 6,297,520 B1
(45) Date of Patent: *Oct. 2, 2001

(54) ACTIVE MATRIX SUBSTRATE AND CORRECTING METHOD OF STRUCTURAL DEFECT THEREOF

(75) Inventors: Masumi Kubo; Toshihiro Yamashita; Yoshimitsu Tajima, all of Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/377,830

(22) Filed: Aug. 20, 1999

Related U.S. Application Data (63) Continuation of application No. 08/842,795, filed on Apr. 15, 1997, now Pat. No. 5,977,563.

(30) Foreign Application Priority Data

May 9, 1996 (JP) ................................ 8-114499
Nov. 14, 1996 (JP) ................................ 8-302822

(51) Int. Cl.[7] ............................................ H01L 29/04
(52) U.S. Cl. ................... 257/72; 257/59; 349/42; 349/43
(58) Field of Search .................... 257/59, 72; 349/42, 349/43, 45, 54, 192

(56) References Cited

U.S. PATENT DOCUMENTS

| 5,132,819 | 7/1992 | Noriyama . |
| 5,641,974 | 6/1997 | den Boer et al. . |
| 5,682,211 | 10/1997 | Yao et al. . |
| 5,977,563 | * 11/1999 | Kubo et al. ............................ 257/72 |

FOREIGN PATENT DOCUMENTS

| 1-48037 | 2/1989 | (JP) . |
| 4-261521 | 9/1992 | (JP) . |
| 324819/1992 | 11/1992 | (JP) . |
| 5-165055 | 6/1993 | (JP) . |

* cited by examiner

Primary Examiner—Alexander O. Williams
Assistant Examiner—Remmon R. Fordé
(74) Attorney, Agent, or Firm—Nixon & Vanderhye P.C.

(57) ABSTRACT

In an active matrix substrate having thereon a matrix of pixels each composed of a pair of a TFT and a pixel electrode, when the shorting of the pixel electrodes in adjacent pixels occurs, an electrical connection between the pixel electrode and drain electrode in the TFT of a matching pair in either of the shorted pixel electrodes is cut. For example, when the shorting of two adjacent pixels occurs, the pixel electrodes in both the pixels are driven by the TFT in the non-cut pixel. This arrangement makes it possible to make a display defect resulted from the shorting of adjacent pixels on the active matrix substrate less noticeable, and hence to upgrade display quality.

12 Claims, 9 Drawing Sheets

ACTIVE MATRIX SUBSTRATE AND CORRECTING METHOD OF STRUCTURAL DEFECT THEREOF

This is a continuation of application Ser. No. 08/842,795, filed Apr. 15, 1997, U.S. Pat. No. 5,977,563, the entire content of which is hereby incorporated by reference in this application.

FIELD OF THE INVENTION

The present invention relates to an active matrix substrate forming a liquid crystal panel, and to a correcting method of a structural defect thereof caused during the fabrication sequence.

BACKGROUND OF THE INVENTION

A liquid crystal panel of an active matrix type liquid crystal display device is composed of two substrates placed in parallel to keep a predetermined space and a liquid crystal filled in the space. One of the two substrates is called an active matrix substrate and the other is called an opposing substrate. In some cases, a 3-color filter of RGB or YMC is provided on the opposing substrate.

Figure 9:
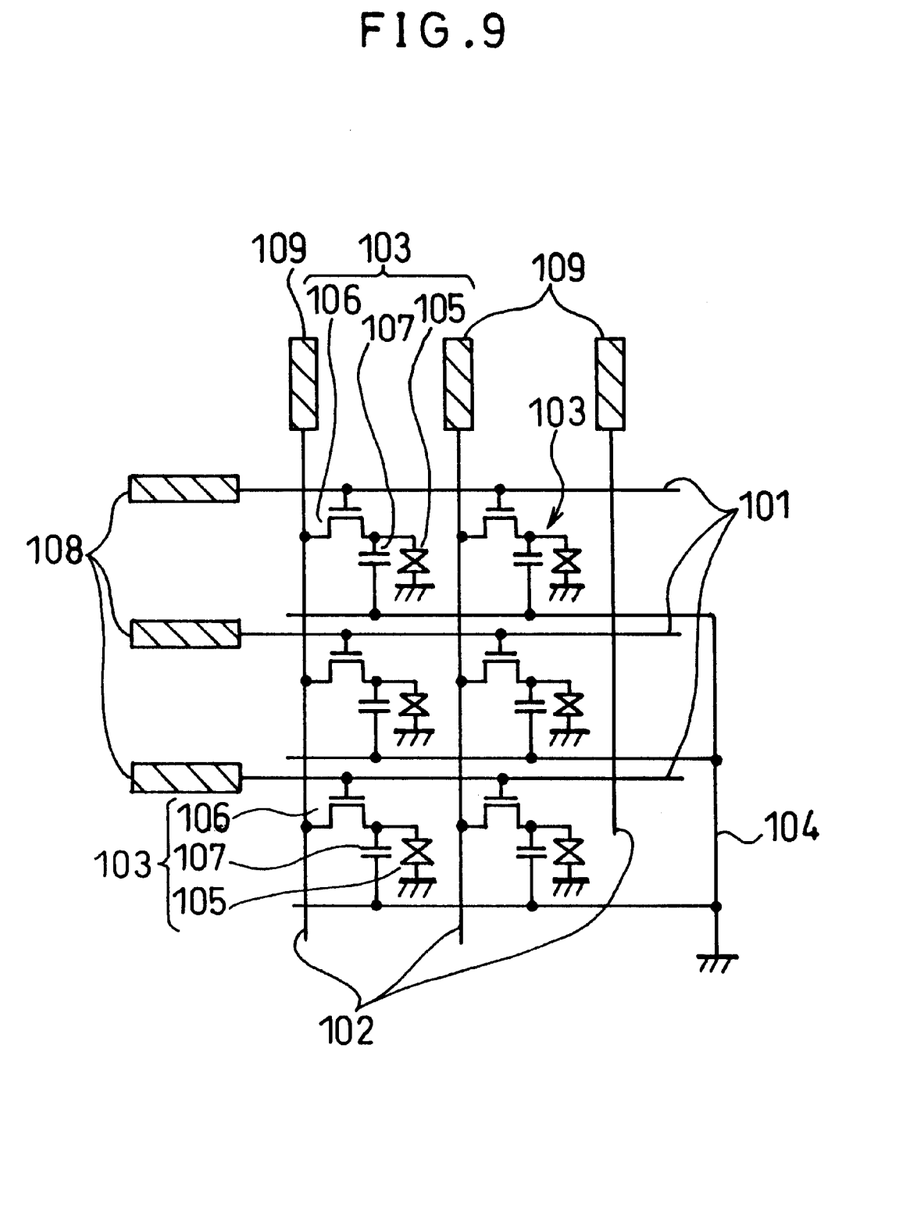
FIG. 9 is a circuit diagram depicting a structure of a conventional active matrix type liquid crystal display device.

As shown in FIG. 9, provided atop of the active matrix substrate are a plurality of gate wires 101 aligned in rows to serve as scanning lines, a plurality of source wires 102 aligned in columns to serve as signal lines, and a plurality of pixels 103 formed in a matrix area of the wires 101 and 102 which intersect at right angles with each other. Also, provided atop of the opposing substrate is a common electrode 104.

Each pixel 103 mainly comprises a pixel electrode 105 and a switching element 106, such as a thin film transistor (TFT). The pixel 103 used herein further comprises an additional capacity 107. Also, a leading terminal 108 and a leading terminal 109 are provided to each gate wire 101 and each source wire 102, respectively.

Recently, there has been an increasing demand for an active matrix substrate with higher definition, and to meet such a demand, a numerical aperture of the pixel 103 has been increasing. One possible method of increasing a numerical aperture is to narrow a space between the pixel electrodes 105 in adjacent pixels 103, but this method poses problems as specified below.

That is, the shorting of the pixel electrodes 105 in two adjacent pixels 103 occurs if the patterning during the fabrication sequence of the active matrix substrate is defective and the pixel electrodes 105 are not separated completely. Or even when the pixel electrodes 105 in two adjacent pixels 103 are separated completely, the shorting occurs if scraps of electrode conductive films of the switching element 106 fall in the space between the pixel electrodes 105 during the pattering step.

When this kind of shorting occurs in a longitudinal direction of the gate wire 101, two kinds of source signals written into the pixel electrodes at the timing of the same gate signal are mixed, and a potential of each shorted pixel 103 is brought to an intermediate potential, whereby a display defect occurs. The display defect becomes noticeable when the liquid crystal panel is driven by providing a display signal having alternating polarities to a plurality of source wires 102, because two source signals having different polarities are impressed on the adjacent pixel electrodes, respectively. On the other hand, when the shorting occurs in a longitudinal direction of the source wire 102, two shorted pixels 103 are driven by the writing action of the switching element 106 in either pixel 103 whichever has the later gate signal input timing. Thus, a source signal written by the switching element 106 in the other pixel 103 having the earlier gate signal input timing must be cancelled. However, this makes the writing action by the switching element 106 in the pixel 103 having the later input timing difficult, which results in a display defect.

Incidentally, the fabricated active matrix substrate is subject to inspection, and if any shorting is discovered, a laser beam is irradiated to the shorting spot to remove a material causing the shorting. However, since such a short-causing material is in an extremely narrow space between the pixel electrodes 105, it is tedious and inefficient to set an irradiation point and only a quite low success rate is achieved. Moreover, the fragments of the removed material may fall in the space between the pixel electrodes 105 again and cause the shorting at a different spot. Therefore, the above conventional method needs improvement.

SUMMARY OF THE INVENTION

It is therefore an object of the present invention to provide (1) an active matrix substrate which can make a display defect resulted from the shorting of adjacent pixels less noticeable to upgrade display quality, and (2) a correcting method of a structural defect of such an active matrix substrate.

To fulfill the above object, an active matrix substrate of the present invention having thereon a matrix of pixels each of which includes a pair of switching element and a pixel electrode is characterized in that it has a cut-off portion where an electrical connection between the pixel electrode and the switching element of a matching pair is cut in one of adjacent pixels having a shorting between their respective pixel electrodes.

According to the above arrangement, when the shorting of the pixel electrodes in the adjacent pixels occurs, an electrical connection between the pixel electrode and the switching element of a matching pair is cut in either of the shorted pixels. Under these conditions, the other pixel is restored to resume a normal operation while the above pixel in which the electrical connection is cut is driven together with the restored pixel. Thus, even when the shorting of the pixel electrodes in the adjacent pixels occurs, the mixing of source signals and the writing of the resulting mixed signal can be prevented. Since only one kind of source signal is written into the pixel electrodes, the display defect becomes less noticeable, thereby enabling a high-quality liquid crystal display.

When the shorting of the pixel electrodes in the adjacent pixels occurs, the electrical connection is cut in any of the following manners:

(1) a connection between the pixel electrode and the drain electrode of the switching element is fused;

(2) a connection between the gate electrode of the switching element and scanning line is fused; and (3) a connection between the source electrode of the switching element and signal line is fused.

Therefore, every time the shorting of the pixel electrodes in the adjacent pixels occurs, the electrical connection is cut in any of the above manners to prevent the mixing of more than one source signal and the writing of the resulting mixed signal into the pixel electrodes in a reliable manner, thereby suppressing the display defects.

In particular, when the pixel electrode and the drain electrode of the switching element of a matching pair is connected through a connecting electrode, such as a transparent conductive film, a connection between the pixel electrode and the drain electrode of the switching element can be cut using a laser beam or the like. In this case, a success ratio increases because a larger cut-off region is secured.

Also, to fulfill the above object, a method of the present invention for correcting a structural defect of an active matrix substrate that includes an insulating substrate; a plurality of parallel scanning lines provided on the insulating substrate; a plurality of signal lines provided to intersect at right angles with the plurality of scanning lines; a plurality of switching elements, each switching element being a thin film transistor connected to a portion near each intersection of the scanning lines and signal lines, respectively; a transparent insulating film covering the scanning lines, signal lines, and switching elements to make a surface of the active matrix substrate flat; and a matrix of pixel electrodes provided on the transparent insulating film, each pixel electrode being connected to a drain electrode of each switching element via a contact hole made through the transparent insulating film, thereby to form a pixel with each switching element as a matching pair. The method is characterized in that an electrical connection between the pixel electrode and the switching element of a matching pair is cut in one of adjacent pixels having a shorting between their respective electrodes instead of correcting a shorting spot directly.

According to the above arrangement, when the shorting of the pixel electrodes in the adjacent pixels occurs, the shorting spot is not corrected, but instead, a connection between the pixel electrode and switching element is cut in either shorted pixel. Unlike an action of removing a short-causing material from an extremely narrow space between the pixel electrodes in adjacent pixels, this cutting action does not demand a highly precise positioning of an irradiation point and can be carried out in a relatively large region. As a consequence, the manipulation of the correcting action is simplified and the correcting action is accelerated while increasing a success ratio.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 8 and 10 through 12, the following description will describe an example embodiment of the present invention. Assume that an active matrix substrate of the present embodiment is used in a transmission-type liquid crystal display device.

Figure 10:
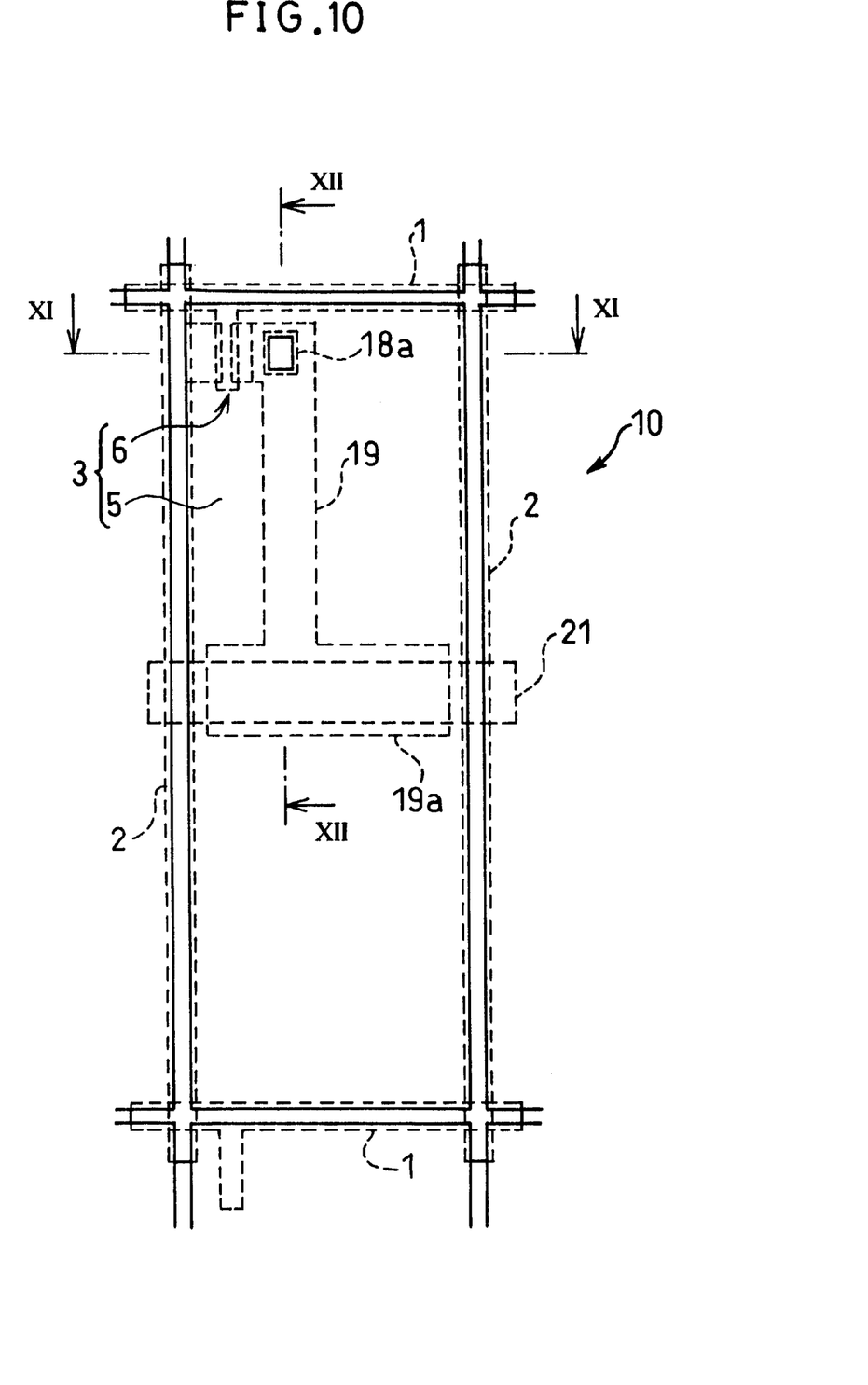
FIG. 10 is a plan view depicting a structure of a pixel in the active matrix substrate in accordance with the above example embodiment.

FIG. 10 illustrates one of a plurality of pixels 3 formed on an active matrix substrate 10. The active matrix substrate 10 includes a plurality of gate wires 1 placed in rows to serve as scanning lines, a plurality of source wires 2 placed in columns to serve as signal lines, and a plurality of the pixels 3 formed in a matrix area of the wires 1 and 2 which intersect at right angles with each other. Each pixel 3 mainly comprises a pixel electrode 5 and a thin film transistor (TFT) 6 serving as a switching element.

Figure 11:
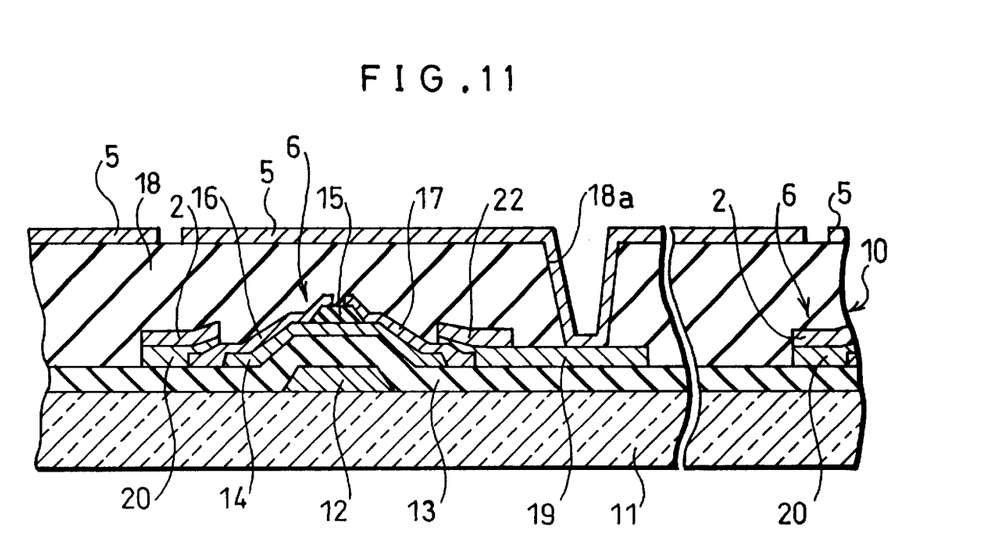
FIG. 11 is a cross section taken on line XI—XI in FIG. 10.

FIG. 11 is a cross section taken on line XI—XI in FIG. 10. The TFT 6 is of a reverse-stagger structure arranged in the following manner. That is, the TFT 6 comprises a transparent insulating substrate 11, on which a gate electrode 12, a gate insulating film 13, a semiconductor layer 14, and a channel protecting film 15 are layered from bottom to top. Also a source electrode 16 and a drain electrode 17 are provided to cover the edge portions of the channel protecting layer 15 and a part of the semiconductor layer 14, respectively, while securing a space therebetween on the channel protecting layer 15.

The source wire 2 is formed over the edge portion of the source electrode 16 through a conductive film 20, while a conductive film 22 is formed over the edge portion of the drain electrode 17 through a connecting electrode 19 made of a transparent conductive film. Further, a transparent film 18 is formed over the source wire 2, TFT 6, conductive film 22, and connecting electrode 19 to make the surface of the active matrix substrate 10 flat. Here, the connecting electrode 19 is extended and connected to the pixel electrode 5 via a contact hole 18a made through the transparent insulating film 18.

As has been explained, in the active matrix substrate 10 of FIG. 10, the gate electrode 12 of the TFT 6 is connected to the gate wire 1, so that the TFT 6 is driven under the control of an input gate signal to the gate electrode 12. Also, the source electrode 16 of the TFT 6 is connected to the source wire 2, so that a source signal is inputted therein. Further, the drain electrode 17 of the TFT 6 is connected to the pixel electrode 5 through the connecting electrode 19 and contact hole 18a. The drain electrode 17 is also connected to an additional capacity electrode 19a, which is made by extending the edge of the connecting electrode 19 to oppose the pixel electrode 5 around its center.

Figure 12:
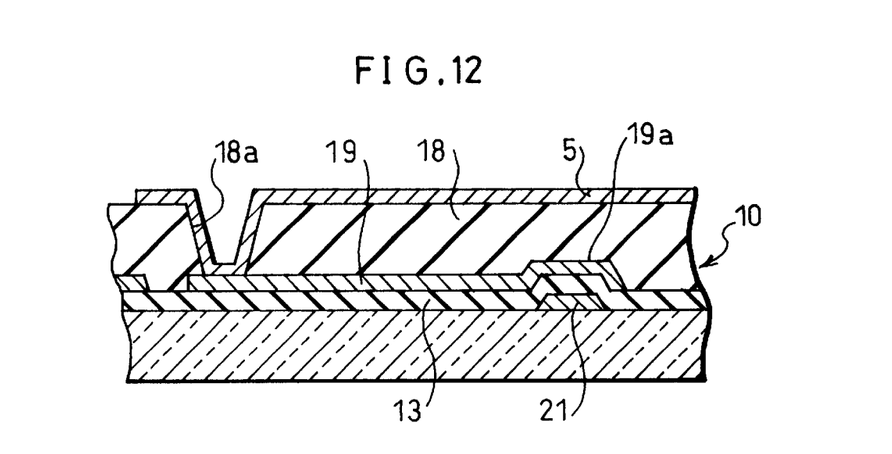
FIG. 12 is a cross section taken on line XII—XII in FIG. 10.

As can be seen from FIG. 12 showing the cross section taken in line XII—XII in FIG. 10, an additional capacity 7 (see FIG. 5) for the pixel electrode 5 is composed of the additional capacitive electrode 19a, an additional capacitive opposing electrode 21 provided to oppose the additional capacitive electrode 19a, and the gate insulating film 13 sandwiched with these electrodes 19a and 21. The additional capacitive opposing electrode 21 is connected to a common electrode 4 illustrated in FIG. 5. In addition, a leading terminal 8 and a leading terminal 9 are connected to each gate wire 1 and each source wire 2, respectively.

According to the above arrangement, a matrix of pixel electrodes 5 are provided on the active matrix substrate 10 in such a manner that neither gate wire 1 nor source wire 2 is provided between every two adjacent pixel electrodes 5, thereby making it possible to increase numerical aperture and improve definition of each pixel 3.

However, in the above-arranged active matrix substrate 10, a matrix of the pixel electrodes 5 are barely spaced apart. Thus, the shorting of the pixel electrodes 5 are highly likely as was explained in the BACKGROUND OF THE INVENTION column. For example, when the active matrix substrate 10 is used in a 1.3-in. or 12.1- in. liquid crystal panel, only a space as narrow as 2–5 μm is secured between the pixel electrodes 5.

To solve this problem, the active matrix substrate 10 of the present embodiment is arranged in such a manner that, when the shorting of the pixel electrodes 5 in the two adjacent pixels 3 occurs, the shorting spot is not corrected, and instead, an electrical connection between the pixel electrode 5 and TFT 6 is cut in either shorted pixel 3. The above arrangement makes it possible to restore either shorted pixel 3, so that the restored pixel 3 is driven normally while the other shorted pixel 3 is driven together with the restored pixel 3.

Figure 1:
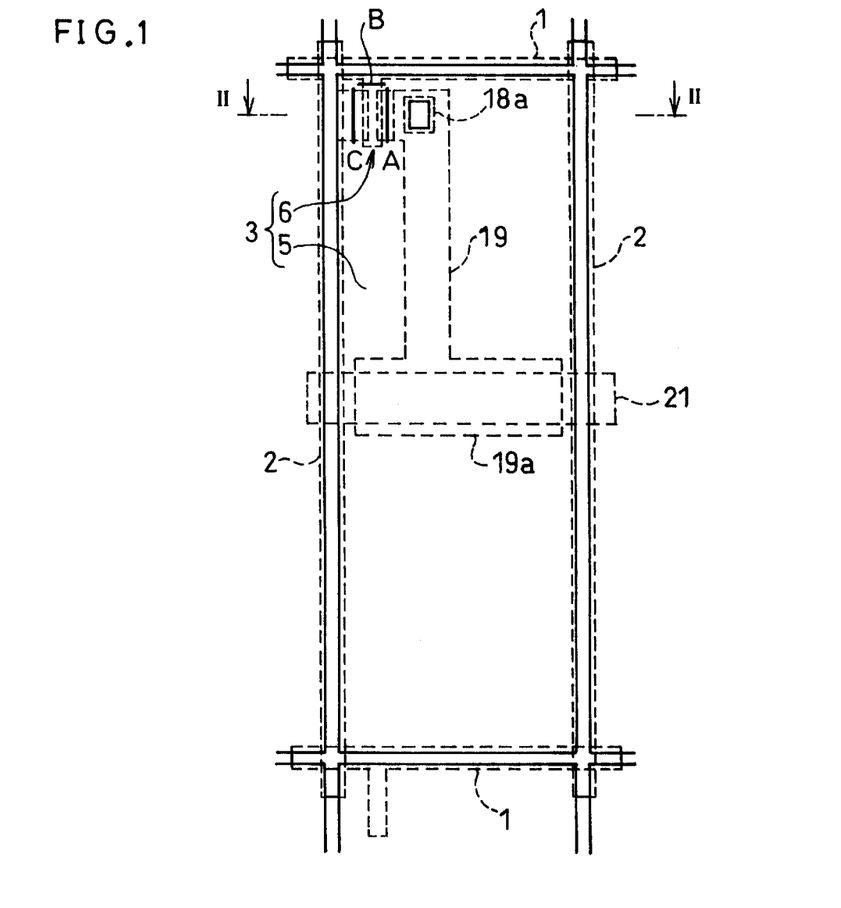
FIG. 1 is a plan view showing cut-off portions in a pixel on an active matrix substrate in accordance with an example embodiment of the present invention.
Figure 2:
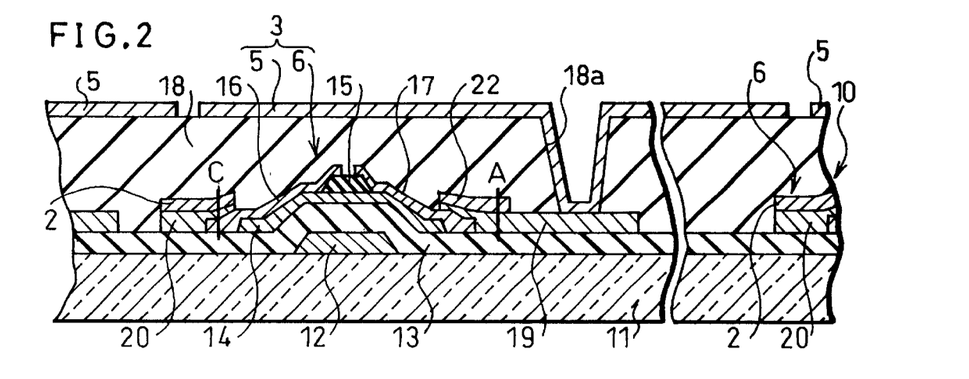
FIG. 2 is a cross section taken on line II—II in FIG. 1.

More specifically, to cut the connection between the pixel electrode 5 and TFT 6, at least one out of three points denoted by capital letters A, B, and C in FIG. 1 or 2 is fused by applicable cutting means, such as a laser cut apparatus. Point A is a connection between the pixel electrode 5 and the drain electrode 17 of the TFT 6, point B is a connection between the gate wire 1 and the gate electrode 12 of the TFT 6, and point C is a connection between the source wire 2 and the source electrode 16 of the TFT 6.

The laser cut apparatus can fuse an intended portion alone by converging a laser beam to a portion subject to fusion inside the active matrix substrate 10 to heat that specific portion intensively. This fusing action is carried out only when a shorting is discovered through the inspection of the fabricated active matrix substrate 10.

Next, the cutting operation of the points A, B, and C will be explained separately.
(1) Point A When point A, namely, the connection between the pixel electrode 5 and the drain electrode 17 of the TFT 6 is fused, although the fused TFT 6 comes ON, no source signal is provided from the fused TFT 6 to the pixel electrode 5 of a matching pair. Thus, a source signal written into the other non-fused pixel electrode 5 is also written into the fused pixel electrode 5. This prevents the mixing of two kinds of source signals and the writing of the resulting mixed signal into the pixel electrodes 5 in the two shorted pixels 3. Since only one kind of source signal is written into the pixel electrodes 5, the display defect becomes less noticeable.
(2) Point B When point B, namely, the connection between the gate wire 1 and the gate electrode 12 of the TFT 6 is fused, the fused TFT 6 stays OFF and no source signal is provided from the fused TFT 6 to the pixel electrode 5 of a matching pair. Thus, a source signal written into the other non-fused pixel electrode 5 is also written into the fused pixel electrode 5. This prevents the mixing of two kinds of source signals and the writing of the resulting mixed signal into the pixel electrodes 5 in the two shorted pixels 3. Since only one kind of source signal is written into the pixel electrodes 5, the display defect becomes less noticeable.
(3) Point C When point C, namely, the connection between the source wire 2 and the source electrode 16 of the TFT 6 is fused, although the fused TFT 6 comes ON, no source signal is provided from the fused TFT 6 to the pixel electrode 5 of a matching pair. Thus, a source signal written into the other non-fused pixel electrode 5 is also written into the fused pixel electrode 5. This prevents the mixing of two kinds of source signals and the writing of the resulting mixed signal into the pixel electrodes 5 in the two shorted pixels 3. Since only one kind of source signal is written into the pixel electrodes 5, the display defect becomes less noticeable.

Thus, fusing at least one of points A, B, and C can make the display defect of the two shorted pixels 3 less noticeable. Since two pixel electrodes 5 are driven by only one TFT 6, it is difficult to charge the shorted pixels 3 compared with normal pixels 3, but this disadvantage is negligible because it does not cause any display defect. In addition, the shorting can be corrected in the above manner whether it occurs in a longitudinal direction of the gate wire 1 or source wire 2.

Herein, it is point A, where the connecting electrode 19 and conductive film 22 are layered, that is cut to fuse the connection between the pixel electrode 5 and drain electrode 17 of the TFT 6. However, the same can be done in a manner illustrated in FIGS. 3 and 4. That is, a contact hole 28a made through the transparent insulating film 18 is placed on the additional capacitive electrode 19a, and when the shorting of the pixel electrodes 5 in the two adjacent pixels 3 occurs, a point denoted by a capital letter D is fused, in other words, the connecting electrode 19 is fused at any point between the contact hole 28a and conductive film 22. As a consequence, an electrical connection between the pixel electrode 5 and drain electrode 17 of the TFT 6 can be cut. Moreover, since the fusing spot can be an arbitrary point within a broader region in this case, a laser beam can be irradiated more easily, thereby improving the efficiency of the overall operation.

Figure 3:
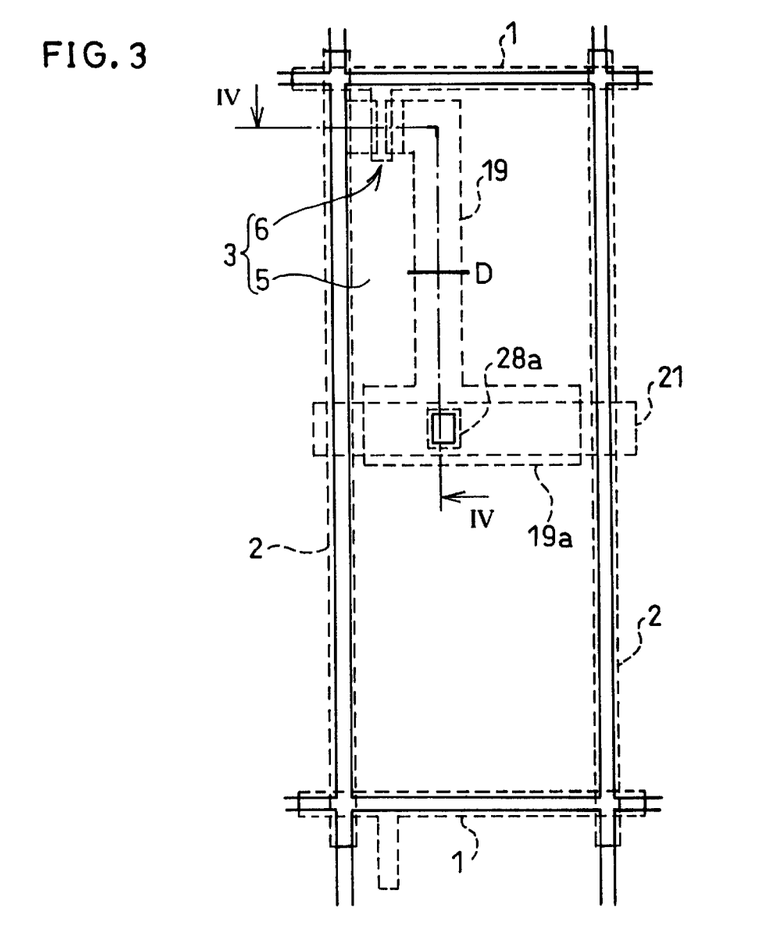
FIG. 3 is a plan view showing another cut-off portion.
Figure 4:
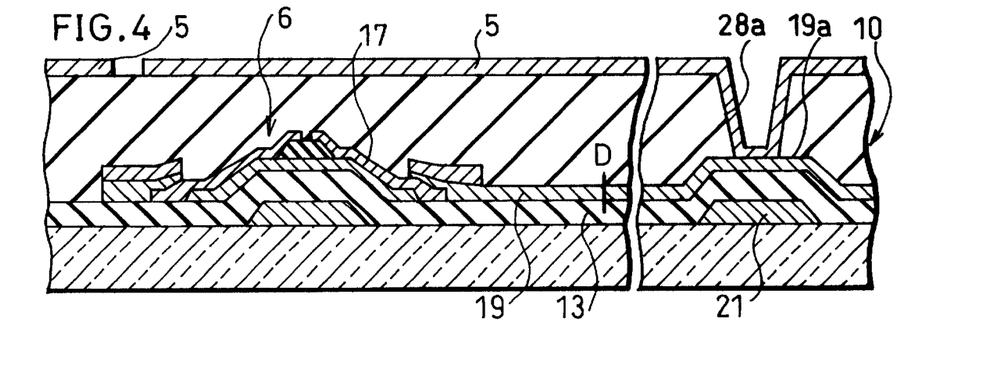
FIG. 4 is a cross section taken on line IV—IV in FIG. 3.
Figure 6:
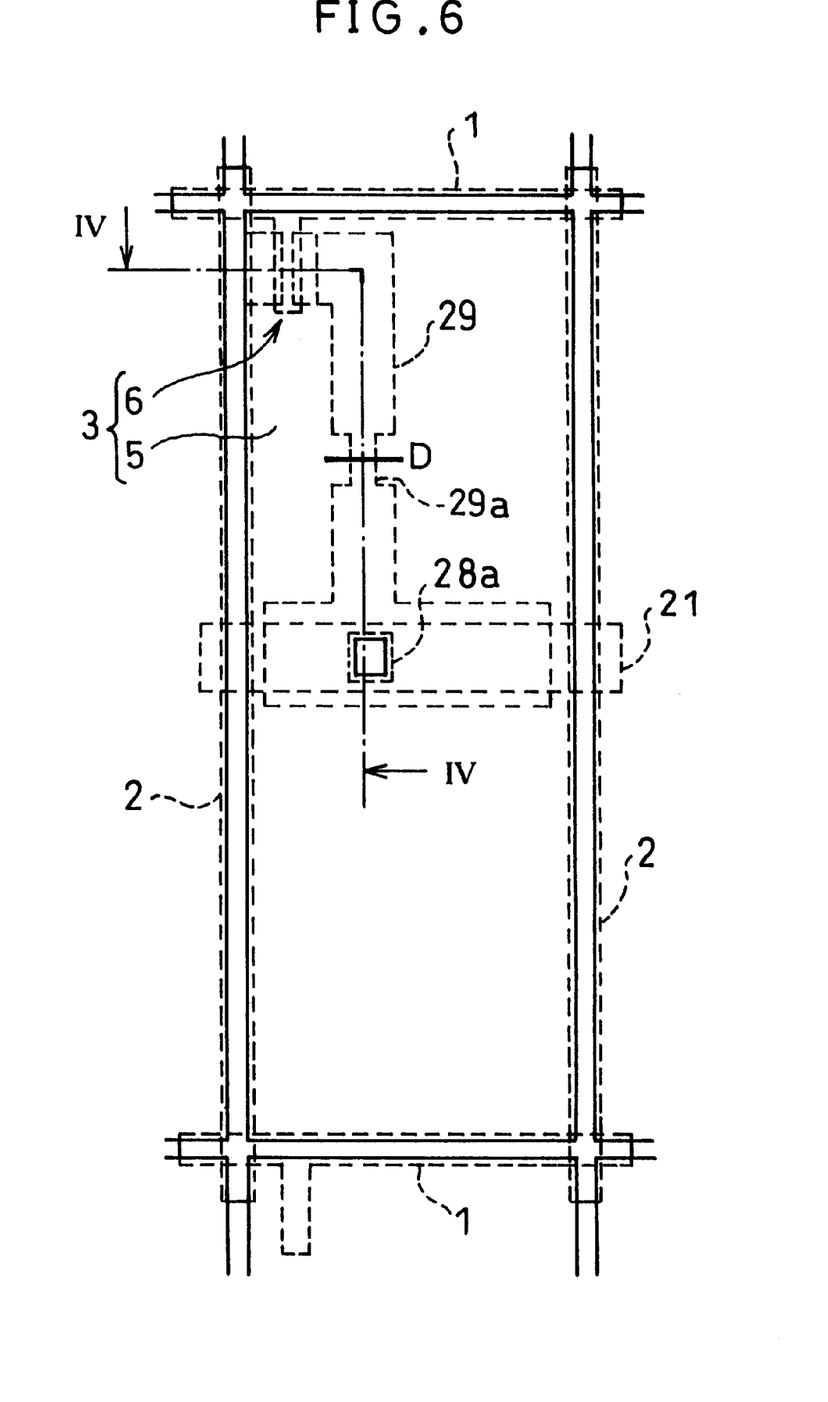
FIG. 6 is a plan view showing a cut-off portion of another shape in a connecting electrode.

In addition, like the connecting electrode 19 in FIG. 3, the connecting electrode may have a constant width, or may be modified as a connecting electrode 29 in FIG. 6. That is, a part of the connecting electrode 29 is reduced in width to make a cut-off portion 29a. When the shorting of the pixel electrodes 5 in the two adjacent pixels 3 occurs, point D positioned in the narrower cut-off portion 29a is cut by a laser beam. Also, the connecting electrode may be modified as a connecting electrode 39 in FIG. 7. That is, the connecting electrode 39 is formed to oppose almost a half of the pixel electrode 5, and a part of the same is reduced in width to make a cut-off portion 39a. Like the connecting electrode 29, when the shorting of the pixel electrodes 5 occurs, point D positioned in the narrower cut-off portion 39a is cut by a laser beam. Line VI—VI in each of FIGS. 6 and 7 corresponds to line VI—VI in FIG. 3 and FIG. 4 shows a cross section taken on each line VI—VI.

Figure 7:
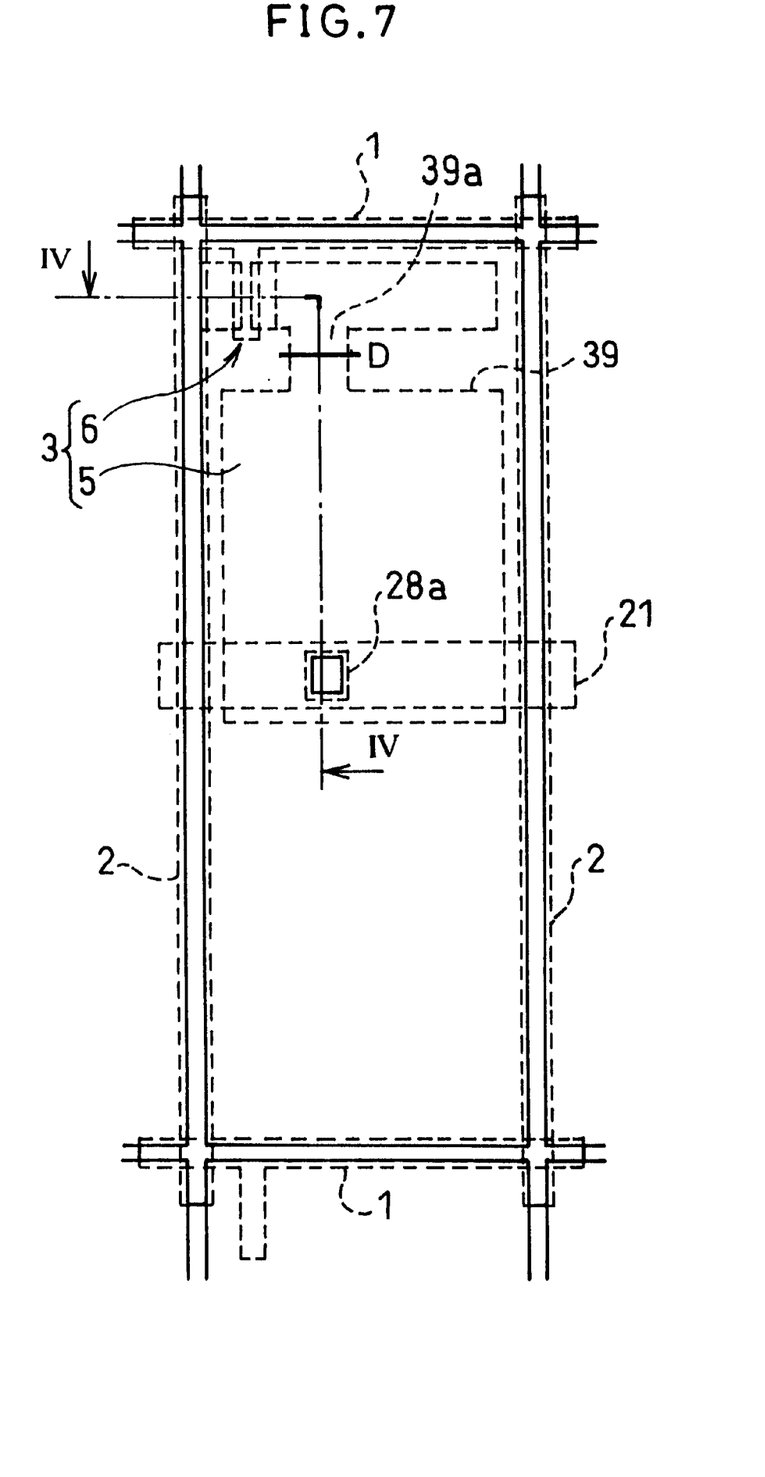
FIG. 7 is a plan view showing a connecting electrode of another shape.

In the latter two examples, a width of the connecting electrode connecting the pixel electrode and drain electrode of the TFT is reduced partially to form the cut-off portion, so that the cut-off portion is fused to cut the connection between the pixel electrode and TFT in a shorted pixel. In this case, when a laser beam is used to cut the connection, a laser beam has to be irradiated to a smaller area, thereby saving energy in the cutting action. This arrangement can further curb the damage to an orientation film or liquid crystal material by a laser beam, and therefore, makes the display defect less noticeable. Also, in case that the connecting electrode is formed to oppose almost a half of the pixel electrode, frequencies of the line disconnection in the connecting electrode can be reduced.

Figure 8:
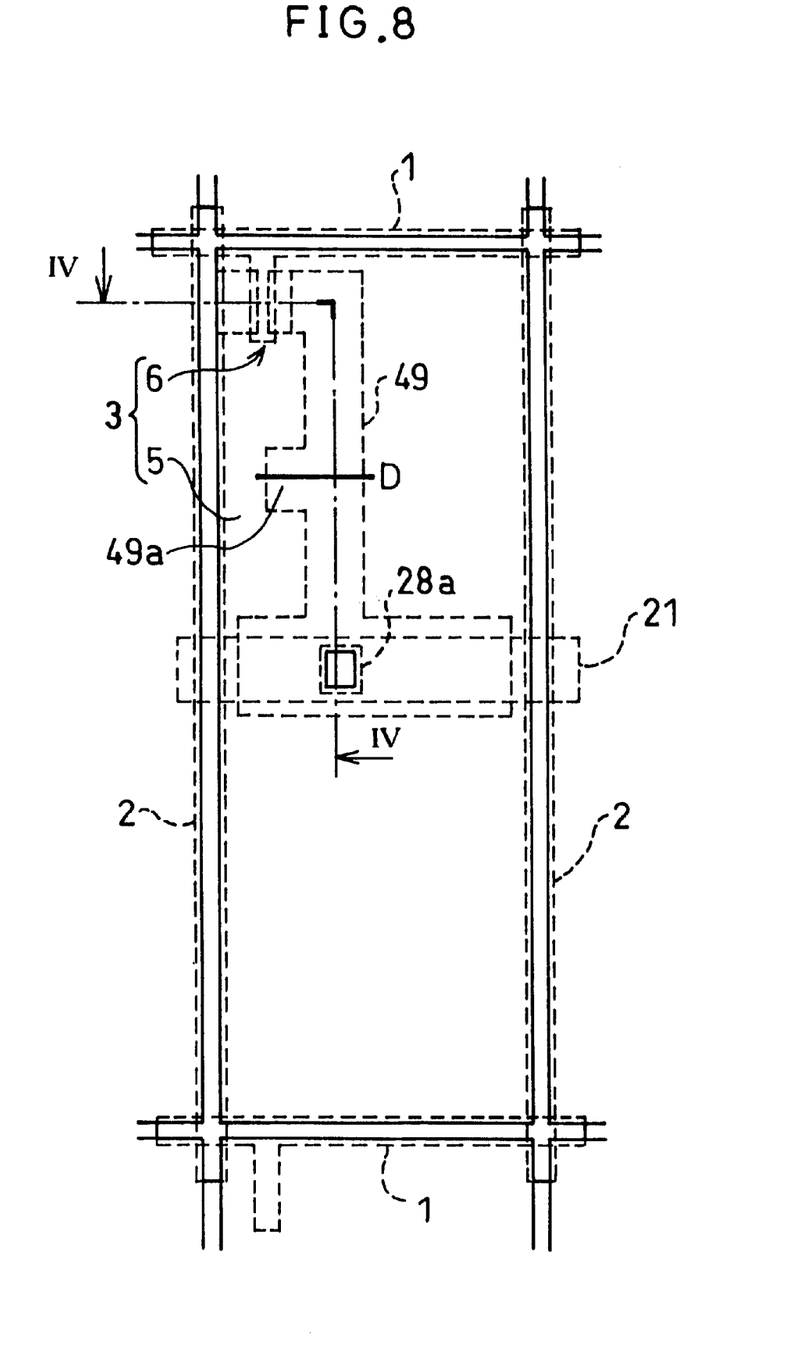
FIG. 8 is a plan view showing a cut-off portion of a further shape in the connecting electrode.

Further, the connecting electrode may be modified as a connecting electrode 49 in FIG. 8. That is, a part of the connecting electrode 49 is widened to make an an image recognizing portion 49a in a shape recognizable as an image by an image recognizing apparatus. In this case, the image recognizing portion 49a is used to set an irradiation point of a laser beam, so that point D can be readily recognized as an image. Consequently, not only a laser beam can be irradiated in a precise manner, but also the cut-off action can be carried out easily in a reliable manner. Further, the image recognizing apparatus can focus a laser beam onto point D automatically. Thus, not only the shorting can be corrected in less time by irradiating a laser beam, but also a laser beam can be used in a simpler and easier manner. Besides the shape of the above portion 49a, the shapes shown in FIGS. 6 and 7 and the like are also applicable.

Figure 5:
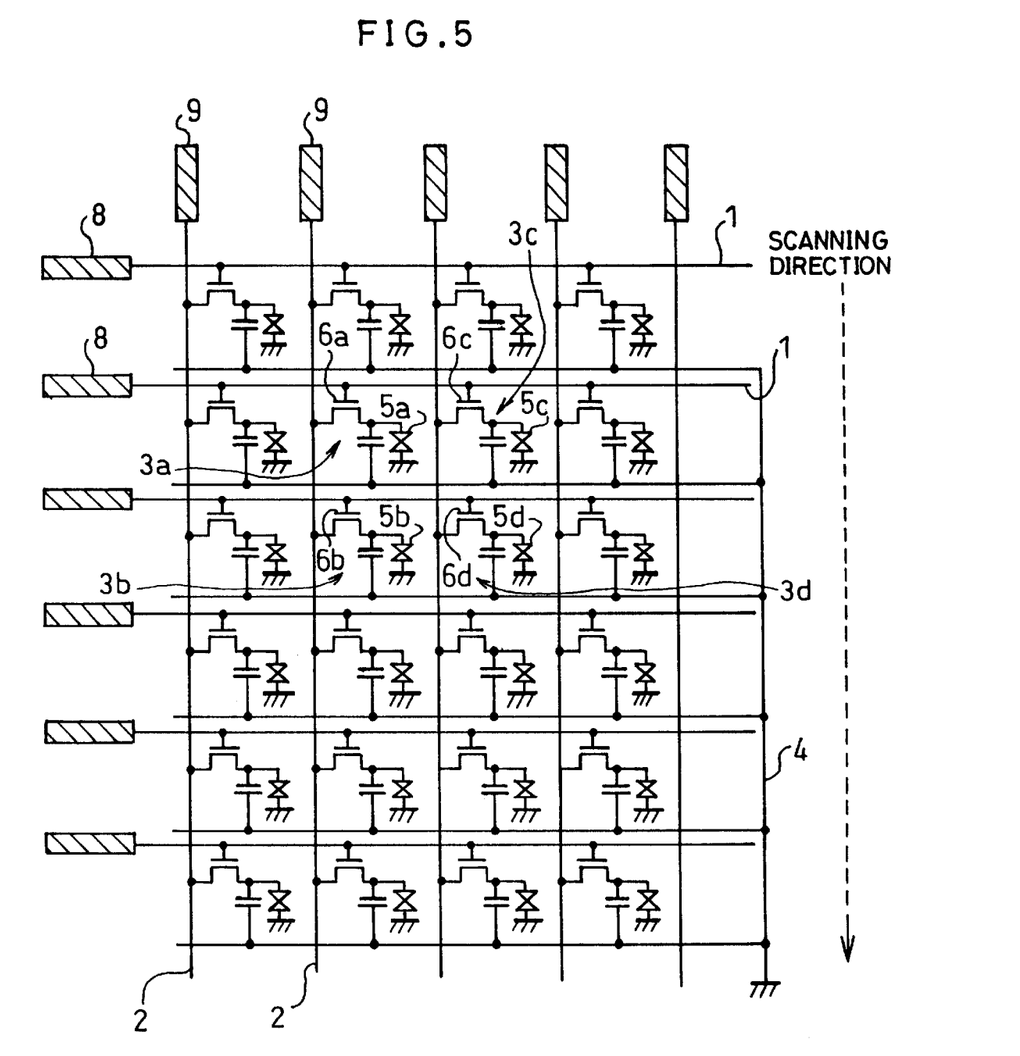
FIG. 5 is a circuit diagram depicting a structure of a liquid crystal display device having the above active matrix substrate.

Incidentally, when two adjacent pixels 3a and 3b on the same source wire 2 having the shorting in their respective pixel electrodes 5a and 5b as illustrated in FIG. 5 are compared, a gate signal impressing timing comes earlier in the pixel 3a than the pixel 3b because a gate signal scans from the pixel 3a to the pixel 3b.

When there is a time difference in the gate signal impressing timings like the above case, if the electrode pixel 5b whose gate signal impressing timing comes later than the other is cut from the drain electrode of the TFT 6b of a matching pair to correct a display defect resulted from the shorting, a signal inputted into the pixel 3a having the earlier gate signal impressing timing is impressed to both the pixel electrodes 5a and 5b. When this happened, a gate-drain capacity of the TFT 6b in the cut pixel 3b changes an effective value of charges being added to the pixel electrodes 5a and 5b, which changes transmission on the display, whereby the display defect becomes more noticeable.

To solve this problem, in case there occurs the shorting of the pixel electrodes 5a and 5b in their respective adjacent two pixels 3a and 3b on the same source wire 2, a connection between the pixel electrode 5a having the earlier gate a signal impressing timing and the drain electrode of the TFT 6a of a matching pair is cut at point A or D. By so doing, a gate-drain capacity of the TFT 6a in the pixel 3a does not cause any adverse effect and the transmission on the display can remain the same, thereby making the display defect less noticeable.

Also in the above case, each of the pixel electrodes 5a and 5b having a shorting may have another shorting with the pixel electrodes 5c and 5d in their respective adjacent pixels 3c and 3d on the same gate wires 1. Here, source signals are written respectively into these four shorted pixel electrodes 5a–5d at different gate signal impressing timings. More specifically, source signals inputted into the pixels 3a and 3c having the earlier gate signal impressing timing are impressed to the pixel electrodes 5a–5d concurrently in the first place. Then, in the second place, source signals inputted into the pixels 3b and 3d having the later gate signal impressing timing are impressed to the pixel electrodes 5a–5d concurrently.

However, if the active matrix substrate is arranged to be driven by the source signals giving alternating polarities to adjacent gate wires 1 to prevent flicker, the above source signal impressing action can cause a display defect. To solve this problem, a connection between the pixel electrode and TFT is cut by cutting a connection between the drain electrode and pixel electrode using a laser beam in each pixel in either a set of the pixels 3a and 3c having the earlier gate signal impressing timing or a set of the pixels 3b and 3d having the later gate signal impressing timing. Under these conditions, the pixels 3a–3d are driven by the signals inputted into the other set of two pixels in which a connection between the drain electrode and pixel electrode in each pixel is maintained.

As a result, the set of two pixels in which the connection between the drain electrode and pixel electrode is cut in each pixel are driven by the other set of two pixels in which a connection between the drain electrode and pixel electrode in each pixel is maintained. Since this arrangement can make the latter set of two pixels free from the adverse effects of the source signals of a reversed polarity inputted into the former set of two pixels, the display defect becomes less noticeable.

In this case, if the pixel electrodes 5b and 5d in their respective pixels 3b and 3d having the later gate signal impressing timing are separated from their respective drain electrodes, signals inputted into the other pixels 3a and 3c having the earlier gate signal impressing timing are impressed to the four pixel electrodes 5a–5d concurrently. However, a gate-drain capacity changes an effective value of charges being added to the pixel electrodes 5a–5d when the gate signals are written into the TFT 6b and 6d in their respective pixels 3b and 3d in which the connections are cut. This changes transmission on the display and makes the defect noticeable.

For this reason, it is preferable to cut a connection between the pixel electrodes 5a and 5c having the earlier gate signal impressing timing and the drain electrodes of the TFTs 6a and 6c of their respective matching pairs. Because by so doing, signals inputted into the pixels 3b and 3d having the later gate signal impressing timing are impressed to the four pixel electrodes 5a–5d. Accordingly, the pixel electrodes 5a–5d are driven without any adverse effect from the gate-drain capacity when the gate signals are written into the TFTs 6a and 6c in their respective pixels 3a and 3c in which the connections are cut. Moreover, transmission on the display can remain the same. As a consequence, it has become possible to make the display defect less noticeable.

The active matrix substrate of the present embodiment is applicable to a single-color (R, G, or B) liquid crystal panel and a liquid crystal panel with a 3-color filter of RGB or the like. A projection-type liquid crystal display device comprises three single-color liquid crystal panels, and a direct-view-type liquid crystal display device comprises one liquid crystal panel with a 3-color filter. Using YMC instead or RGB does not eliminate the effects of the present embodiment.

Since information of one color is displayed on a single liquid crystal panel, the effects of the present embodiment are more obvious in the projection-type liquid crystal display device.

In contrast, in case of the direct-view-type liquid crystal display device, a source signal of a color different from an originally assigned color is impressed to the pixel electrode in one of the two shorted pixels whichever fused. Thus, fusing the pixels carelessly can eliminate the effects of the present embodiment. To prevent this problem, it is preferable to fuse a pixel assigned to a less visible (eye-sensitive) color. More specifically, since visibility becomes higher in order of blue, red, and green, the display defect is made less noticeable in the following manner: (1) a pixel assigned for blue is fused when two pixels respectively assigned for red and blue, or green and blue are shorted; and (2) pixels assigned for blue and red are fused when three pixels respectively assigned for red, green, and blue are shorted.

In the present embodiment, the shorting of the pixel electrodes in two adjacent pixels is used as an example. However, the display defect can be made less noticeable in case of the shorting of more than two pixel electrodes as well. In other words, in any case, all the shorted pixels except one are fused, so that the only non-fused pixel can be resorted and resume a normal operation.

Although the TFT of the present embodiment is of the reverse-stagger structure, a TFT of a stagger structure and a planer-type TFT are also applicable. That is to say, a structural defect, such as the shorting, can be corrected in the above manner in any type of TFT.

The TFT is used as the switching element in the present embodiment; however, a 3-terminal-type switching element and a 2-terminal-type switching element are also applicable.

An intended portion is fused by the laser cut apparatus serving as the cutting means in the present embodiment. However, since only the electrical connection between the pixel electrode and drain electrode or the like needs to be cut, the physical connection between the same can be cut or the pixel electrode and drain electrode or the like can be simply separated instead.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An active matrix substrate, comprising:
   a matrix of a plurality of switching elements and first electrodes;
   a plurality of parallel scanning lines;
   a plurality of signal lines intersecting at right angles with said plurality of scanning lines;
   an insulating substrate having formed thereon said scanning lines, signal lines and switching elements; and
   an insulating film formed on said insulating substrate, said insulating film being provided for forming said first electrodes on a different layer from said scanning lines, signal lines and switching elements.
   wherein at least either of a scanning line and signal line connected to one of adjacent pixel electrodes is different from that connected to the other of the adjacent pixel electrodes, and wherein said active matrix substrate includes a portion to be electrically disconnected between one of the first electrodes and a corresponding switching element.

2. The active matrix substrate as claimed in claim 1, further comprising a second electrode conducting said one of the first electrodes and the corresponding switching element.

3. The active matrix substrate as claimed in claim 2, wherein said second electrode is connected to the corresponding switching element, and wherein said second electrode is connected to the first electrode via a contact hole.

4. The active matrix substrate as claimed in claim 2, wherein said portion to be electrically disconnected is in part of said second electrode.

5. The active matrix substrate as claimed in claim 2, wherein said portion to be electrically disconnected is a cut-off portion in part of said second electrode, which has a narrower width than a remaining portion of said second electrode.

6. The active matrix substrate as claimed in claim 5, wherein said portion to be electrically disconnected has a width that permits an electrical connection to be cut by fusing with an application of a laser beam.

7. The active matrix substrate as claimed in claim 2, wherein said portion to be electrically disconnected is in part of said second electrode at which an electrical connection is cut by fusing with an application of a laser beam.

8. The active matrix substrate as claimed in claim 7, further comprising an insulating film formed over a disconnected part of said second electrode.

9. The active matrix substrate as claimed in claim 1, wherein the first electrodes are pixel electrodes, and wherein said active matrix substrate includes a matrix of pixels having a shorting between adjacent pixels.

10. The active matrix substrate as claimed in claim 2, wherein said second electrode is a connecting electrode, and said one of said first electrodes is a pixel electrode, and wherein said active matrix substrate includes a matrix of pixels having a shorting between adjacent pixels.

11. The active matrix substrate as claimed in claim 10, wherein said portion to be electrically disconnected is a cut-off portion in part of said connecting electrode which has a narrower width than a remaining portion of said connecting electrode.

12. The active matrix substrate as claimed in claim 10, wherein said connecting electrode is connected to the switching element and is connected to the pixel electrode via a contact hole.

* * * * *